United States Patent [19]

Gosselin

[11] Patent Number: 4,979,903

[45] Date of Patent: Dec. 25, 1990

[54] SURFACE MOUNTABLE CONTACT ELEMENT AND ASSEMBLY

[75] Inventor: Jacques P. Gosselin, Paris, France

[73] Assignee: E. I. Du Pont de Nemours and Company, Wilmington, Del.

[21] Appl. No.: 428,835

[22] Filed: Oct. 30, 1989

[30] Foreign Application Priority Data

Nov. 1, 1988 [NL] Netherlands ............... 8802678

[51] Int. Cl.⁵ ............................................. H01R 9/09
[52] U.S. Cl. ............................... 439/78; 439/82; 439/876; 439/885
[58] Field of Search ............................. 439/78-83, 439/876, 883, 885, 247

[56] References Cited

U.S. PATENT DOCUMENTS

| | | | |
|---|---|---|---|
| 3,846,743 | 11/1974 | Garver | 439/876 |
| 3,993,383 | 11/1976 | Marino | 439/885 |
| 4,037,898 | 7/1977 | Guyette | 439/82 |
| 4,211,466 | 7/1980 | Reynolds | 439/885 |
| 4,603,930 | 8/1986 | Ito | 439/78 |

FOREIGN PATENT DOCUMENTS

| | | | |
|---|---|---|---|
| 0658280 | 4/1965 | Belgium | 439/78 |
| 2706467 | 8/1978 | Fed. Rep. of Germany . | |
| 2806683 | 8/1979 | Fed. Rep. of Germany . | |

OTHER PUBLICATIONS

IBM Technical Disclosure Bulletin, vol. 21, No. 12, mei 1979, New York U.S., bladzijde 4805 b. chrzanowski et al.: "surface-connected connector".

*Primary Examiner*—Paula A. Bradley

[57] ABSTRACT

A contact element and contact element assembly of electrically conducting material, intended, in particular, for surface mounting at a connecting area near the edge of a circuit substrate comprising an opening or recess. The contact element has a flat base face which in the mounted state of the contact element is situated completely or partially opposite the connecting area. The contact element also has at least one positioning device which projects from the flat base face and extends into the opening or recess of the substrate the contact element is mounted to the positioning device may be a positioning finger which fits freely into the opening or recess, or a positioning finger which acts on the substrate in a manner such that a retaining force is provided for keeping the contact element in position.

20 Claims, 4 Drawing Sheets

U.S. Patent    Dec. 25, 1990    Sheet 1 of 4    4,979,903
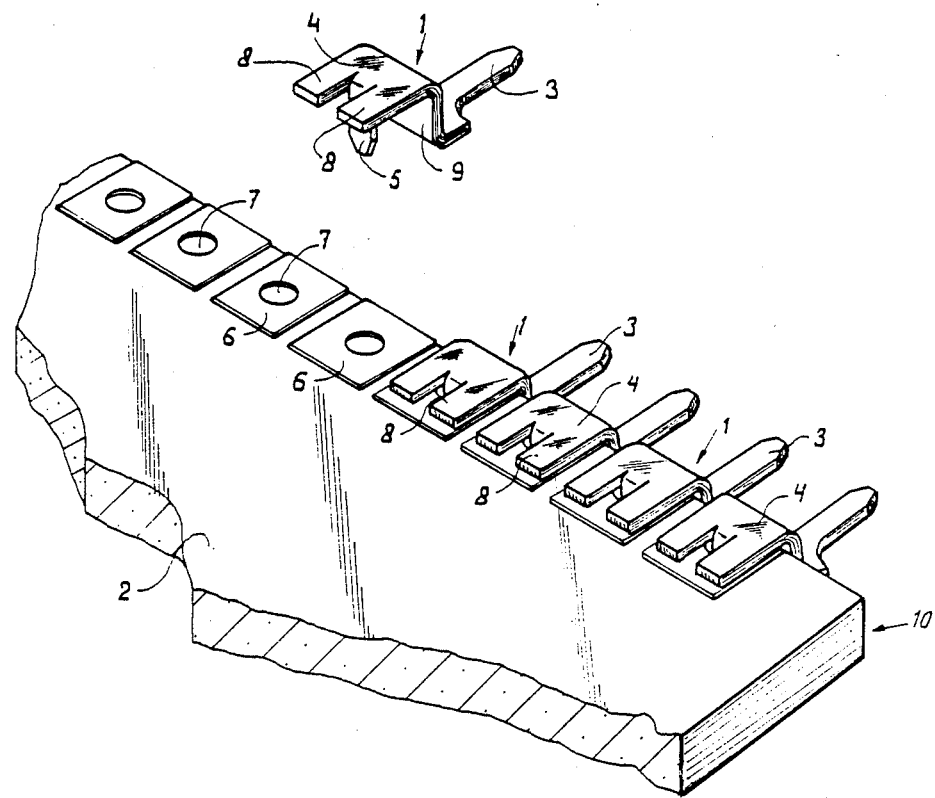
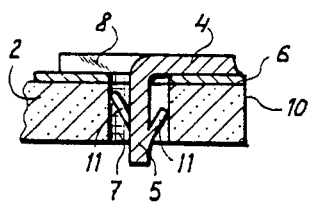
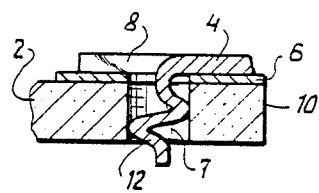
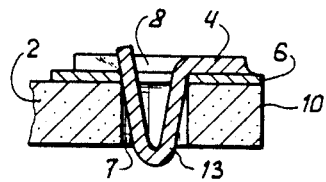

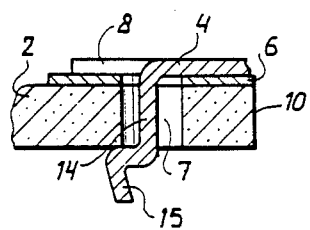
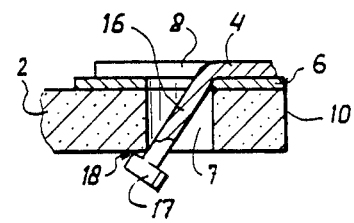
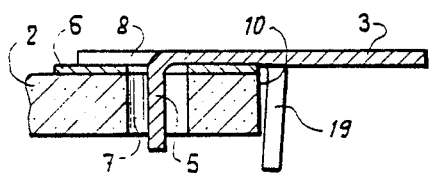
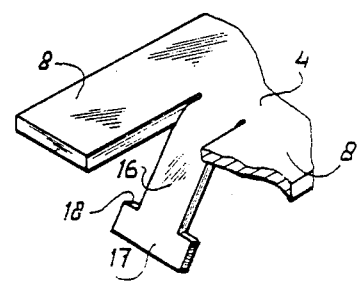
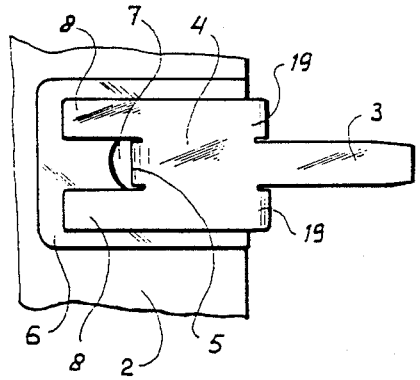
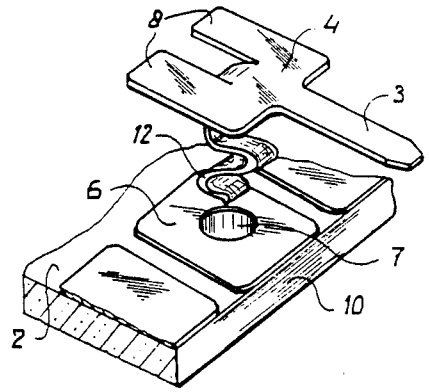

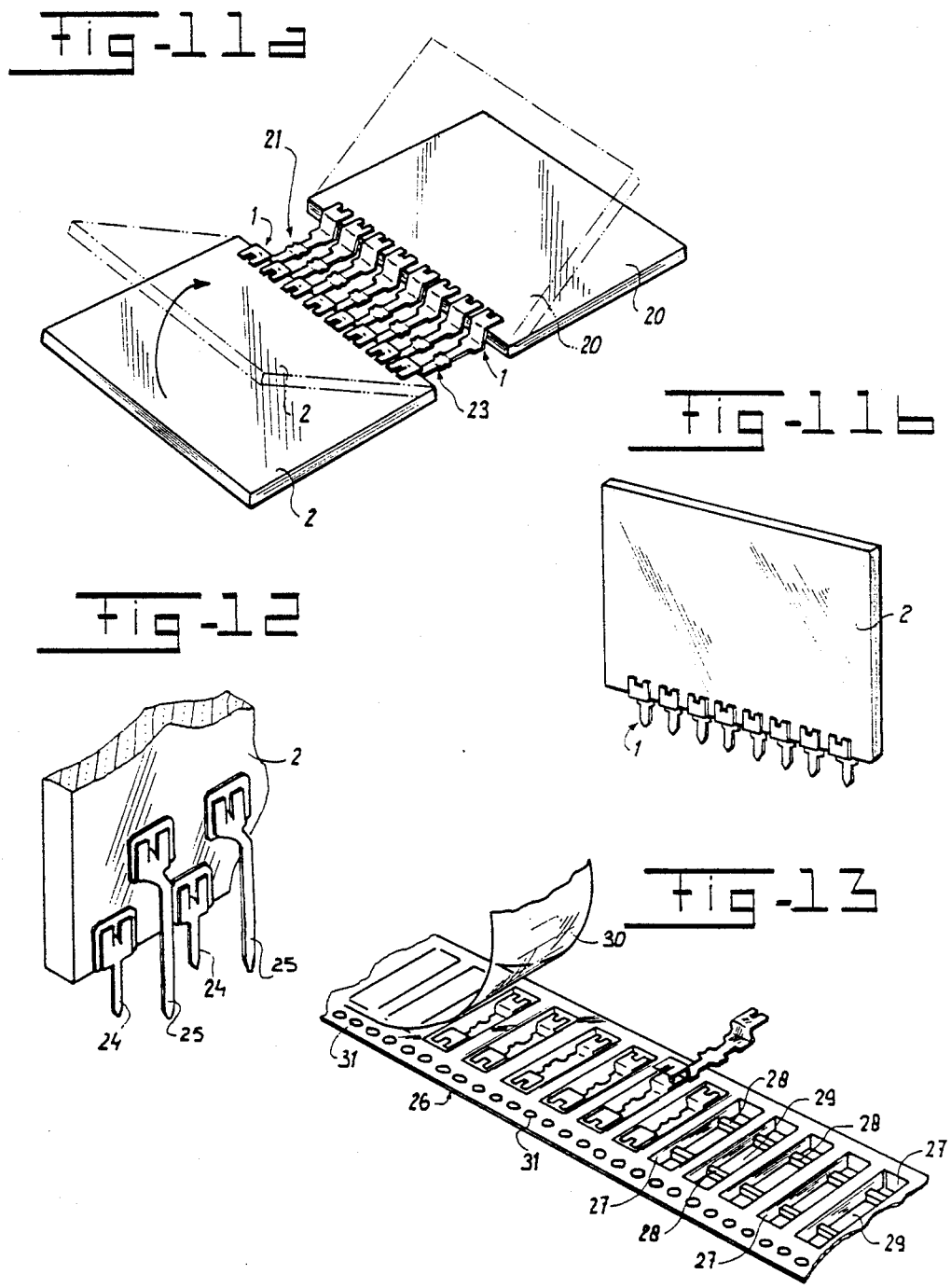

SURFACE MOUNTABLE CONTACT ELEMENT AND ASSEMBLY

BACKGROUND OF THE INVENTION

The invention relates to an electrical contact element and, in particular, to surface mounting of electrical contact elements to a connecting area of electrically conducting material situated near the edge of a substrate.

For mutually detachable electrical connection of circuit parts, plug and socket connections have been used on a large scale. In principle, one can distinguish between two types of connections based upon their construction. In one type of connection devices, the contact elements are accommodated in a separate, sometimes specially shaped housing. In the other type, the contact elements are mounted directly onto a substrate without such housing. The present invention is concerned with the latter type of construction.

Surface mounting is increasingly replacing the older insertion methods for electrically connecting of circuit elements to a substrate or a printed wiring board. In surface mounting, the connecting ends of the circuit elements are connected to small connecting areas on one face of a substrate. The respective components may be mounted on the connecting areas, inter alia, by means of various soldering techniques and/or with electrically conducting adhesive.

Problems, however, arise in surface mounting a row of contact elements, for example, near an edge of a substrate or a printed wiring board. One problem involves correctly positioning the contact elements with respect to each other and with respect to the edge of the substrate.

If the contact elements are mutually displaced or if they are displaced with respect to the edge of the substrate, it will not be possible, or it will be possible only with great difficulty, to introduce a row of plug-in contact elements into a corresponding row of receiving openings or receiving contact elements. In this connection, it should be borne in mind that, in practice, plug-and-socket connections having twenty contact elements or more with a pitch distance of 1.27 mm or less are used. A relatively small error in positioning one or a few contact elements may result in a circuit board provided with complex electronic circuits, being unusable in practice. Moreover, the reliability of the plug-and-socket connection will not be favorably influenced if undesirable mechanical forces are exerted on one or more contact elements.

SUMMARY OF THE INVENTION

The present invention is therefore based on the object of providing a contact element which can be surface mounted with a high degree of accuracy at a desired position near the edge of a substrate. According to the invention, this object is achieved in that the connecting side of the contact element has a flat base face which, in the mounted state of the contact element, is situated completely or partially opposite the connecting area, with at least one positioning device which projects with respect to the flat base face and which extends into an opening or recess in the substrate when the contact element is mounted.

Together with the associated opening or recess in the substrate, the positioning device guarantees a precise positioning of the contact element, since it is possible for the flat base face to be connected in an electrically conducting manner to the respective connecting area on the substrate according to surface mounting techniques. It will be clear that the contact element according to the invention is suitable, in particular, for the automated mounting thereof because the position of the opening or recess in the substrate determines the mutual distance between the contact elements in a row and the position of the contact element with respect to the edge of the substrate. No complicated mounting operations are consequently necessary to be able to achieve the required positioning accuracy in an automated process.

An advantageous embodiment of the contact element according to the invention has the characteristic that the positioning device is a positioning finger which fits freely into the opening or recess of the substrate.

In order to prevent a contact element which has been placed on a respective connecting area from moving before it is secured in an electrically conducting manner, a further embodiment of the invention has the characteristic that the positioning device is a positioning finger which, in the mounted state, acts on the substrate in a manner such that a retaining force is provided for keeping the contact element in position.

Yet a further embodiment of the invention based on this has the characteristic that the positioning finger is provided with laterally projecting teeth which act on the substrate in the opening or recess. These teeth provide sufficient retaining force for keeping the contact element in a desired position prior to the electrical connection thereof to the respective connecting area on the substrate.

Yet a further embodiment of the contact element according to the invention has the characteristic that the positioning finger is provided in the vicinity of the free end with a stop device which acts on a face of the substrate in the mounted state. The stop device is preferably integral with the positioning finger and, according to embodiments of the invention, may be, inter alia, a lip situated transversely on the positioning finger or a protuberance formed from the positioning finger.

According to embodiments of the invention, the positioning finger itself may be constructed, inter alia, as a straight pin, with a meandering (i.e. curved, serpentine) shape, or with a bent back shape. The straight pin form is eminently suitable for contact elements having a positioning finger engaging freely in the opening or recess in the substrate. With the meander shape or bent back shape, an adequate clamping force can already be exerted on the wall of the opening or recess to hold the contact element in a desired position prior to the connection thereof to a connecting area. In principle, the positioning device may be attached as a separate device to the base face at the connecting side of the contact element.

According to the invention, an embodiment of the contact element which is advantageous for production engineering has, on the other hand, the characteristic that the positioning finger is formed from the flat base face. A satisfactory connection of the contact element to the contact area on the substrate from the point of view of mechanical loading capacity is obtained, in particular, if the positioning finger is surrounded on either side by striplike parts of the flat base face.

The mechanical loading capacity and the positioning accuracy of the contact element according to the invention are advantageously improved in that the flat base face is provided, at the end facing the contact side, with at least one further stop device which is situated opposite the said edge of the substrate in the mounted state of the contact element. This further stop device fulfils a dual task, namely the absorption of mechanical forces in the longitudinal direction of the contact element, for example in making contact to a further contact element, and the guarantee that the contact element is positioned at a particular angle with respect to the edge of the substrate, generally a right angle. After all, in a row of contact elements it is essential that the contact elements are all directed at the same angle with respect to the edge of the substrate in order to achieve the result that contact can be easily made to a row of further contact elements.

A further embodiment of the contact element according to the invention based on this has the characteristic that the connecting side has an approximately L-shaped section of which one leg is the flat base face and of which the other leg is the at least one further stop device, extending in the same direction as the positioning device, in the form of a stop face. In the mounted state of the contact element, the stop face lies parallel to the edge of the substrate, as a result of which mechanical forces exerted on the contact element in the longitudinal direction thereof from the contact side are effectively absorbed by the stop face and the edge of the substrate so that the electrical connection of the connecting area on the substrate and the base face of the contact element are not loaded, or virtually not loaded, mechanically. This latter is primarily of advantage in connecting the contact element to a further contact element by plugging on.

The stop face further ensures that the contact side, which is for example pin-shaped, extends at, for example, a right angle with respect to the edge of the substrate. This means that the directional variations between contact elements in a row of contact elements can be guaranteed within accurate tolerance limits.

Yet another embodiment of the invention has the characteristic that the at least one further stop device is at least one lip extending from the flat base face in the same direction as the positioning device. This lip may also be formed with advantage from the base face of the contact element. Yet another, further embodiment of the invention has the characteristic that the at least one lip is resilient in order to exert a retaining force on the said edge of the substrate to hold the contact element in position in the mounted state of the contact element. It will be clear that a contact element constructed in this manner is equipped both for securing the contact element in a desired position, for balancing the mechanical forces exerted on the contact element, and also for the accurate positioning of the contact element so that is projects in a desired direction with respect to the edge of the substrate.

It has been found that both the positioning accuracy and also the speed of mounting can be increased by providing a contact element assembly comprising two or more contact elements according to the invention, which contact element assembly is characterized in that the contact elements are mutually connected mechanically to each other in pairs by their respective contact side situated opposite each other.

The higher speed of mounting is achieved in that, with such a contact element assembly, two substrates situated opposite each other can be provided simultaneously with one or more contact elements. By further ensuring that the respective openings of said substrates are accurately situated opposite each other during the process of mounting the contact element assembly, a high positioning accuracy is obtained because a positioning device at the end of each contact element pair engages in a respective opening or recess of a substrate as a consequence of which an efficient locking in place is achieved with respect to positional displacement.

Because the contact elements according to the invention can be formed integrally from a metal plate, the contact elements of a contact element assembly may be mutually connected, if necessary, via a metal carrier. The metal carrier may be an elongated metal strip.

In order to be able to detach the contact elements of a contact element assembly easily from each other after mounting, yet a further embodiment of such a contact element assembly according to the invention has the characteristic that the contact element are connected to each other or to the carrier by means of a joining edge such that the contact elements can be separated from each other at the position of the joining edge. Preferably, the joining edge comprises a region of reduced material dimensions compared with the material dimensions at the position of the contact element and/or the carrier. The material dimensions at the joining edge can be chosen so small that the contact elements can be separated by breaking them from each other or from the carrier with such a low force that the connection of the contact element to the connecting area on the substrate is thereby subjected to no load or a negligible load.

As discussed above, the contact element according to the invention is suitable, in particular, for the mounting by automatic means. Consequently, the invention also relates to a holder for a contact element or contact element assembly of two or more contact elements, comprising a row of small storage compartments for receiving the contact element or contact element assembly, characterized in that the small compartments are provided with inwardly facing raised areas such that the contact element or contact element assembly is situated at a distance from the bottom of a small compartment. A holder of this type is suitable, in particular, for continuously feeding contact elements to a machine for mounting the contact elements on a substrate. Because the contact elements are situated at a distance from the bottom of a small compartment, they can readily be removed from a small compartment by means of processing arms. The small compartments are sealed by means of a strip, which strip is gradually removed during the mounting process.

The invention also relates furthermore to a substrate comprising at least one connecting area, comprising an opening or recess, of electrically conducting material, having at least one contact element according to the invention described above.

The invention is explained in more detail below with reference to a number of embodiments shown in the drawing, in which the same components are indicated with the same reference numerals.

BRIEF DESCRIPTION OF THE DRAWING

FIG. 1 shows, in perspective, a preferred embodiment of the contact element according to the invention, before and after mounting on a substrate.

FIGS. 2, 3, 4 show in section the connecting side of embodiments of contact elements mounted on the substrates with positioning fingers positioned in substrate opening to retain the contact elements in position.

FIG. 5 shows in section the connecting side of an embodiment of the contact element wherein positioning finger is provided at its free end with a protuberance which acts on a face of the substrate in the mounted position.

FIGS. 6a and 6b show in section and perspective, respectively, the connecting side of an embodiment of the contact element in which the positioning finger is provided at the free end with a stop lip which acts on the substrate in the mounted state.

FIGS. 7a and 7b show in section and plan view, respectively, an embodiment of the contact element according to the invention in the mounted state, with stop lips acting on the edge of the substrate.

FIG. 8 shows in perspective an embodiment of the contact element without a stop acting on the edge of the substrate.

FIGS. 11a and 11b show in perspective, on a reduced scale, contact element assemblies according to FIG. 10 mounted on two substrates, before and after the separation of the contact elements from each other respectively.

FIG. 12 show in perspective a further embodiment of contact elements according to the invention mounted on a substrate.

FIG. 13 shows in perspective a holder for feeding contact elements or contact element assemblies according to the invention to a processing machine.

DETAILED DESCRIPTION OF THE EMBODIMENTS

Figure 9:
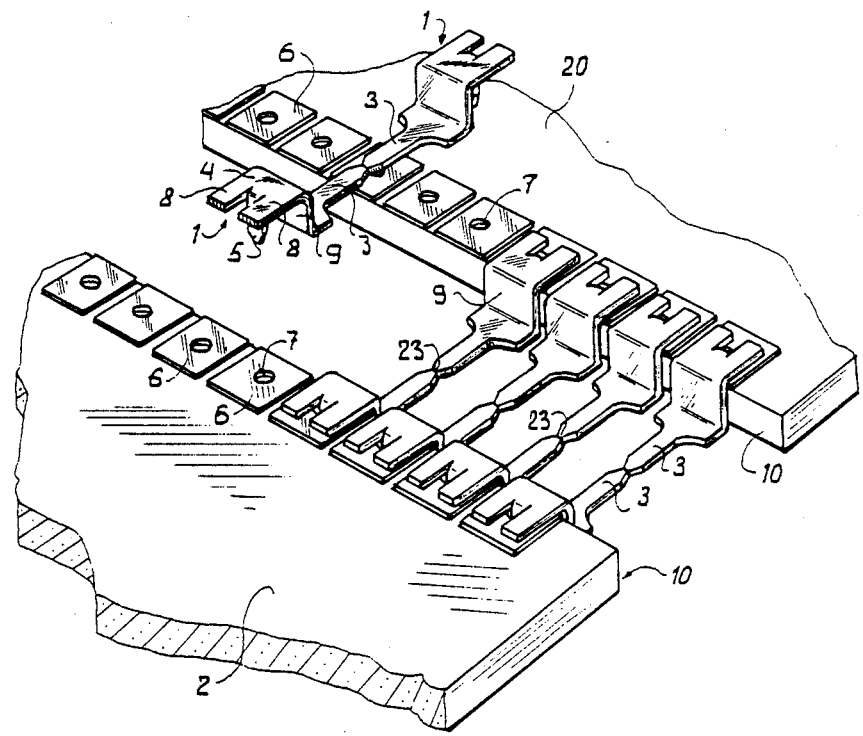
FIG. 9 shows in perspective a contact element assembly with contact elements according to FIG. 1, before and after mounting on two substrates situated opposite each other.

FIG. 1 shows contact elements 1 of electrically conducting material in a preferred embodiment of the invention, before and after mounting on a substrate 2, such as a printed circuit board. The contact elements 1 have a contact side in the form of a flat base face 4 with a positioning finger 5 projecting at a right angle therefrom. The substrate 2 is provided with electrically conducting connecting areas 6 which each comprise an opening 7 for receiving the positioning finger 5 of the contact element 1.

It will be clear to a person skilled in the art that the contact element 1 is not limited to the embodiment shown which has a contact side in the form of a flat contact pin 3 but can be provided in any suitable form for the connecting thereof to a futher contact element or a contact wire such as, for example, a contact socket or an insulation displacement contact (not shown).

In the embodiment shown, the contact element 1 is manufactured as an integral piece, for example, by punching a sheet of electrically conducting material. Under these circumstances, the positioning finger 5 is formed completely or partially from the flat base face 4, flat strips 8 extending on either side of the positioning finger 5. Along with the remaining section of the base face 4, the strips 8 are connected in an electrically conducting manner by means of solder or with electrically conducting adhesive in accordance with surface mounting techniques to a connecting area 6 of the substrate 2 with a required mechanical rigidity.

For a person skilled in the art, it will also be clear that the positioning finger 5 does not necessarily have to extend from the center of the base face, but may also be situated, for example, at an edge thereof. In the latter case, a strip 8 will extend only at one side of the positioning finger 5 (not shown).

The base face 4 of the contact element 1 merges into the contact pin 3 by means of a stop face 9. In the mounted state, the stop face 9 rests against the edge 10 of the substrate 2. As a result, forces exerted on the contact pin 3 in the longitudinal direction during, for example, insertion in a further contact element will exert virtually no force on the mechanical connection of the base face 4 with the connecting area 6.

The stop face 9 and the positioning finger 5 ensure that, in the mounted state, the contact element 1 projects with accurate positioning in a desired direction with respect to the edge 10 of the substrate 2. This is especially important in a row of contact elements as shown because, due the mutual deviations in position of the respective contact elements, making contact with another connector is made much more difficult. The undesired mechanical forces that are thereby exerted on the respective contact elements have a deletereous affect on the reliability of the electrical contact formed.

In the preferred embodiment of the contact element according to FIG. 1, the positioning finger 5, has the form of a flat straight pin which is inserted freely into the opening 7 of the substrate 2. If the assembly of contact elements and substrate is subject to shocks or impacts before the completion of the soldering or bonding process in which the base face 4 or the strips 8 are connected to the connecting area 6, or if the entity has to pass through a soldering bath, for example, with the connecting areas 6 downwards, it is than necessary to provide adequate retaining force to hold the contact element in the desired position.

FIG. 2 shows a further embodiment of the contact element according to the invention mounted on a substrate 2 in which the straight flat positioning finger 5 is provided with teeth 11. The free ends of the teeth 11 are directed in a manner such that the positioning finger can be inserted with a relatively low force into the opening 7 of the substrate 2. The free ends of the teeth 11, however, act on the wall of the opening 7 to provide a relatively large removal force to prevent unwanted removal or movement. The teeth 11 may advantageously be formed from the flat positioning finger 5.

FIG. 3 shows in section a portion of another embodiment of the mounted contact element according to the invention having a meandering or curved, serpentine positioning finger 12. By constructing the meander shape with a larger sideways displacement than the diameter of the opening 7, it is possible to ensure that, in the mounted state of the contact element, an adequate retaining force is exerted on the wall of the opening 7 to hold the contact element in its desired position before and during the surface mounting process.

FIG. 4 shows a portion of yet another embodiment of the contact element according to the invention which is mounted in an opening 7 of a substrate 2 wherein the positioning finger 13 has a bent-back shape. The positioning finger 13 inserted into the opening 7 of the substrate 2 with the bent end exerts on the wall of the opening an adequate force to hold the contact element in its position.

Instead of exerting a retaining force on the wall of the opening in the substrate, the contact element may also be provided with a positioning finger shaped so that the free end thereof projects out of the opening in the mounted state and acts on the face of the substrate at that point. FIG. 5 shows in section a portion of an embodiment of the contact element according to the invention with a positioning finger 14 based on this principle and having a nose-shaped protuberance 15 at its free end whose shorter face acts on a face of the substrate 2 in the mounted state.

FIG. 6a shows in section a portion of an embodiment of the contact element according to the invention with a positioning finger 16, situated obliquely in the opening 7, at the end of which a stop lip 17 is formed. After being introduced into the opening 7, the positioning finger is rotated through an angle (twisted) in a manner such that the shorter edge 18 of the lip 17 acts on the face of the substrate. FIG. 6b shows a perspective reproduction of the connecting side of the contact element according to this embodiment of the invention, with the positioning finger 16 having the lip 17 in the position before the mounting thereof.

Both the positioning finger 14 according to FIG. 5 and the positioning finger 16 according to FIG. 6 may be secured by soldering to the substrate at the side where they project therefrom. This is also true, of course, for the embodiments according to FIGS. 1–4, provided the positioning finger has an adequate length for its free end to project out of the substrate in the mounted state.

Although the substrate is shown with through openings 7 in the embodiments according to FIGS. 1–4, for purely positioning purposes this is not essential per se because a so-called blind opening or recess in the substrate and a suitable length of the positioning finger may be adequate to achieve the intended positioning accuracy and/or rapid mounting of the contact element according to the invention.

In the preferred embodiment of the contact element according to the invention as shown in FIG. 1, the connecting side thereof has an L-shaped section to provide a stop face 9 which rests against the edge 10 of the substrate 2 in the mounted state. Under these circumstances, the contact pin 3 does not extend in the same plane as that in which the base face 4 of the contact element is situated. Another embodiment of the contact element according to the invention having a stop lips 19 resting against the edge 10 of the substrate 2 is shown in FIG. 7a.

Instead of a stop face, the contact element may be provided with two stop lips 19 which act on the edge 10 of the substrate 2 in the mounted state. FIG. 7a shows a section of a mounted contact element and FIG. 7b the plan view thereof. It can clearly be seen that the contact pin 3 is situated in the same plane as the flat base face 4. It will be clear that the contact pin 3 may also lie in a higher or lower position with respect to the base face 4. The stop lips 19 can be constructed, if necessary, in a resilient manner in order to exert a retaining force on the edge 10 of the substrate 2 to hold the contact element in its position prior to the soldering or bonding process.

FIG. 8 shows in perspective an embodiment of the contact element according to the invention without stop device, the necessary retaining force for holding the contact element in position being provided with the aid of the meandering positioning finger 12 shown in FIG. 3. It is also true here that the contact pin 3 may be situated in a displaced position with respect to the base face 4.

As already described in the introduction, the invention also relates to a contact element assembly in which the respective contact side of the contact elements are mechanically mutually connected in pairs situated opposite each other. FIG. 9 shows such a contact element assembly having contact elements according to FIG. 1 in which the contact pins 3 are mutually connected mechanically at their ends. As can be seen, two substrates 2, 20 situated opposite each other can be provided simultaneously with contact elements in one assembly operation.

In addition to the advantage of a high assembly speed because two substrates are provided simultaneously with contact elements, use of contact element assemblies according to the invention also ensures a high positioning accuracy because, together with the associated opening in the respective substrate, the positioning finger situated at each end of a contact assembly forms an efficient positional locking with respect to displacement and rotation of contact elements prior to, and during, the soldering or bonding process according to the surface mounting technique. This is an advantage of the invention which cannot be ignored, especially in the manufacture of large numbers of contact elements.

Figure 10:
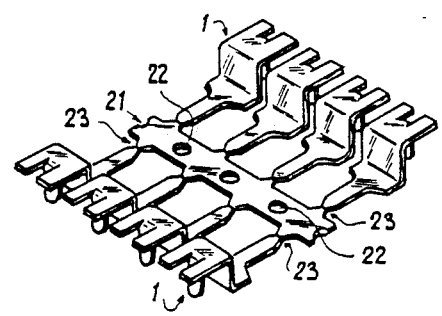
FIG. 10 shows in perspective contact element assemblies of contact elements according to FIG. 1, attached to a carrier strip.

Instead of connecting the contact elements to each other in pairs, they can also be formed into an assembly via a carrier strip 21, as shown in FIG. 10. It will be clear that both the contact element assemblies according to FIG. 9 and those in FIG. 10 can advantageously be formed from one sheet of electrically conducting material. Here, too, contact elements attached to each other in pairs can again be provided by separating the contact element assemblies at the position of the opening 22 from the carrier strip 21.

The contact elements are joined to each other via a joining edge 23. The joining edge 23 is, for example, a region with a small material thickness compared with the thickness of the contact pin 3 of the contact elements. The contact element assemblies can then readily be separated from each other after assembly by, for example, moving the two substrates 2, 20 with respect to each other as is shown by an arrow and broken lines in FIG. 11a. Such a movement has the result that the contact elements are detached from each other or from the carrier 21 at the joining edge 23. The final result is then a substrate having contact elements 1 as shown in FIG. 11b.

FIG. 12 shows a portion of a substrate 2 which is provided with two rows of contact elements 24, 25 according to the invention. The contact elements 24, 25 adjacent to each other may be mounted with a pitch distance of, for example, 1.27 mm.

A plastic holder 26 which comprises a series of small storage compartments 27 in which the contact elements or contact element assemblies to be processed are received is further provided for automatically processing the contact elements or contact element assemblies according to the invention. In order to be able to remove the contact elements or contact element assemblies readily from a small storage compartment 27, for example, by means of a gripping arm, the small storage compartments are provided with inwardly facing raised areas 28 so that the contact elements or contact element assemblies are situated at a distance from the bottom 29 of a small storage compartment 27. A suitable tape 30 helps hold the contact elements in the small storage compartments 27 before the mounting thereof. The holder 26 furthermore has transport openings 31 at one or at both edges for transporting the holder in a processing machine.

Although in the foregoing the invention has been illustrated on the basis of a few exemplary embodiments, it will be clear that a person skilled in the art can provide the contact elements with many modifications and additions without departing from the scope of the present invention in order to provide contact elements equipped with a positioning device for accurate and rapid mounting by surface mounting techniques.

I claim:

1. A contact element of electrically conducting material for mounting in electrical contact to electrical contact areas disposed on a surface of a substrate comprising
   a substantially flat base providing a contact face for connecting to the electrical contact areas of the substrate, said flat base including a pair of strips extending along said contact face.
   a positioning finger formed integrally with and projecting from said flat base between said strips and adapted to be received in a recess formed in the surface of the substrate adjacent each said contact area to maintain the face of the flat base in position on said contact area, and
   contact means extending in a direction opposite to said flat base to mate with other connector means.

2. A contact element according to one of claim 1 wherein the positioning finger is a straight pin.

3. A contact element according to one of the claim 1 wherein the positioning finger is curved in a serpentine shape.

4. A contact element according to one of the claim 1 wherein the positioning finger has a bent-back shape.

5. A circuit board substrate comprising a plurality of electrical contact areas formed along an edge of one main surface of the substrate, and a recess formed adjacent each said contact area, said substrate having surface mounted thereto a plurality of contact element according to claim 1.

6. A contact element according to claim 1 wherein the positioning finger when received in the recess acts on the substrate in a manner such that a retaining force is provided for keeping the contact element in position.

7. A contact element according to claim 6 wherein the positioning finger is provided with laterally projecting teeth which exert a force on the substrate within the recess.

8. A contact element according to claim 6 wherein the positioning finger is provided at its free end with a stop means to engage a face of the substrate when the contact element is mounted.

9. A contact element according to claim 8 wherein the stop means is a lip disposed transversely on the positioning finger.

10. A contact element according to claim 8 wherein the stop means is a proturberance formed from the positioning finger.

11. A contact element according to claim 8 wherein the contact areas are disposed along an edge of the substrate surface and wherein the flat base is provided at its contact face with at least one other stop means which is disposed adjacent the edge of the substrate when the contact element is mounted.

12. A contact element according to claim 11 wherein said other stop means is a projection extending from said flat base in the same direction as the positioning member and providing a stop face against the edge of the substrate.

13. A contact element according to claim 11 wherein the other stop means is at least one lip extending from the flat base face in the same direction as the positioning member.

14. A contact element according to claim 13 wherein said one lip is resilient in order to exert a retaining force on said edge of the substrate to hold the contact element in position when the contact element is mounted.

15. A contact element assembly comprising a plurality of contact elements which are mutually connected mechanically to each other in pairs disposed opposite each other by their respective contact means, each said contact element formed of electrically conducting material for mounting in electrical contact to electrical contact areas disposed on a surface of a substrate, said each contact element comprising
   a substantially flat base providing a contact face for connecting to the electrical contact areas of the substrate,
   positioning means projecting from said flat base and adapted to be received in a recess formed in the surface of the substrate adjacent each said contact area to maintain the face of the flat base in position on said contact area, and
   a contact means extending in a direction opposite to said flat base to mate with other connector means.

16. A contact element assembly according to claim 15 wherein the contact means is a contact pin and the contact elements are mutually connected via their respective contact pins.

17. A contact element assembly according to one of the claim 16 wherein the contact pins of the contact elements are connected to each other via a metal carrier strip by means of a joining edge such that the contact elements can be separated from each other at the position of said joining edge.

18. A contact element assembly according to claim 17 wherein the joining edge is a region of reduced material dimension compared with the material dimensions of the contact elements and the carrier strip.

19. A contact element assembly according to claim 17 wherein the metal carrier is an oblong metal strip.

20. A holder for a contact element of claim 1 or contact element assembly of claim 15 comprising a row of small storage compartments for receiving the contact element or contact element assembly wherein the small compartments are provided with inwardly facing raised areas such that the contact element or contact element assembly is situated at a distance from the bottom of a small compartment.

* * * * *